United States Patent
Peng

(10) Patent No.: US 9,621,185 B1
(45) Date of Patent: Apr. 11, 2017

(54) APPARATUS FOR DIFFERENTIAL AMPLITUDE PULSE WIDTH MODULATION DIGITAL-TO-ANALOG CONVERSION AND METHOD FOR ENCODING OUTPUT SIGNAL THEREOF

(71) Applicant: EGREEN TECHNOLOGY INC., Hsinchu (TW)

(72) Inventor: Sheng Yu Peng, Hsinchu (TW)

(73) Assignee: EGREEN TECHNOLOGY INC., Hsinchu (TW)

( * ) Notice: Subject to any disclaimer, the term of this patent is extended or adjusted under 35 U.S.C. 154(b) by 0 days.

(21) Appl. No.: 15/390,774

(22) Filed: Dec. 27, 2016

(51) Int. Cl.
 H03M 3/00 (2006.01)
 H03F 3/185 (2006.01)
 H03F 3/217 (2006.01)

(52) U.S. Cl.
 CPC ............ H03M 3/506 (2013.01); H03F 3/185 (2013.01); H03F 3/2175 (2013.01); H03F 2200/03 (2013.01)

(58) Field of Classification Search
 CPC ..... H03M 3/506; H03F 3/185; H03F 2200/03
 USPC .................................................. 341/143, 144
 See application file for complete search history.

(56) References Cited

U.S. PATENT DOCUMENTS

| | | | | |
|---|---|---|---|---|
| 7,205,917 B2 * | 4/2007 | Magrath | ............... | H03M 7/302 341/143 |
| 7,649,935 B2 * | 1/2010 | Song | ..................... | H03F 1/3223 320/145 |
| 9,161,122 B2 * | 10/2015 | Tseng | ........................ | H04R 3/00 |

* cited by examiner

*Primary Examiner* — Khai M Nguyen
(74) *Attorney, Agent, or Firm* — Lin & Associates IP, Inc.

(57) ABSTRACT

A differential amplitude pulse width modulation (aPWM) digital to analog converter (DAC) is provided, including an aPWM module for generating differential pulse from an input digital audio data stream, a power driver module for providing energy to a terminal load and a filter for removing unwanted harmonic signal to reconstruct analog signal, wherein the aPWM module further includes a PWM pulse generator to convert the digital input numerical code to a series of time domain pulse width; an amplitude modulation unit, for increasing time domain resolution of the pulse width, and a differential pulse width generator to convert series of PWM pulse into voltage and time domain differential form; the power driver module further comprising a pulse amplitude selector, connected to a power source, and two power stages connected respectively to the pulse amplitude selector.

6 Claims, 10 Drawing Sheets

APPARATUS FOR DIFFERENTIAL AMPLITUDE PULSE WIDTH MODULATION DIGITAL-TO-ANALOG CONVERSION AND METHOD FOR ENCODING OUTPUT SIGNAL THEREOF

FIELD OF THE INVENTION

The present invention generally relates to an apparatus for differential amplitude pulse width modulation (aPWM) digital-to-analog (DAC) conversion and method for encoding output signal thereof, and more specifically to an aPWM-DAC apparatus to generate high SNR PWM signal and encoding differential signal output based on voltage domain and time domain to the aPWM-DAC.

BACKGROUND OF THE INVENTION

A Class-D audio amplifier is a switching amplifier or PWM amplifier. Compared to the 50% power efficiency provided by conventional linear amplifier, the Class-D amplifier usually can provide a high power efficiency over 90%. To obtain a high-SNR Class-D amplifier, a feedback loop is often included. FIG. 1 shows a schematic view of a conventional Class-D amplifier. As shown in FIG. 1, Class-D amplifier is embodied by a PWM generator 102 and a noise shaping sigma-delta modulator 101, wherein the PWM generator 102 outputs complementary signals to a power driver 103 and through a filter 104 to drive a load. The drawback of the above embodiment is that sigma-delta modulation suffers stability problem and the modulator output signal gain is less than 1.

The conventional approach uses digital differential PWM to realize the design shown in FIG. 2. However, this approach requires a very narrow pulse width to overcome the practical technical bather. Hence, in practice, the following two problems must be overcome. The first problem is how to generate such a narrow pulse at low power consumption and low cost; and the second problem occurs when the next-stage of the differential PWM output is a power driver. This is because the pulse signal is even more narrowed when passing a power driver, as a result of dead-time of the power driver and the parasitic capacitance of the MOS transistor. For example, let $T_P$ be the minimum pulse width able to pass the power driver without diminishing, and $T_R$ be the minimum time resolution to reconstruct the input signal S. The imperative issue to solve is how to realize the DAC amplifier able to satisfy the restrictions of $T_P$ and $T_R$ simultaneously.

FIG. 2 shows a schematic view of a differential interpolation pulse width modulation (iPWM) DAC disclosed by U.S. Pat. No. 9,161,122. As shown in FIG. 2, the iPWM DAC includes an iPWM module 210, a power drive stage 220 and a filter 230, wherein iPWM module 210 is connected to a digital audio input and filter 230 is connected to a terminal load 240, for example, a speaker. iPWM module 210 generates differential pulses according to the data stream from the digital audio input, power driver stage 220 provides power to terminal load 240 and filter 230 removes unwanted harmonic signals to reconstruct an analog signal outputted to terminal load 240. iPWM module 210 further includes a PWM pulse generator 211, an interpolation resolution unit 212, a self-calibration unit 213 and a differential pulse generator 214, wherein PWM pulse generator 211 converts the digital audio input to a series of time domain pulses with width; interpolation resolution unit 212 increases the time domain resolution of the pulses; self-calibration unit 213 maintains the pulse-width accuracy of interpolation resolution unit 212; and differential pulse generator 214 converts the series of time domain pulses into voltage and time domain differential form. However, in practice, to generate a pair of pulse signals precisely symmetrical with respect to the time axis and the voltage amplitude, the manufacturing process and the external wiring load must be completely equal, which is relatively difficult to achieve in the actual manufacturing process currently available.

SUMMARY OF THE INVENTION

The present invention has been made to overcome the above-mentioned drawback of conventional PWM digital-to-analog (DAC) convertor. The primary object of the present invention is to provide a differential amplitude pulse width modulation (aPWM) digital to analog converter able to generate exceed 100 dB signal-to-noise ratio SNR of PWM signal without the restriction of manufacturing process and wiring.

Another object of the present invention is to provide an encoding method for the differential amplitude pulse width modulation (aPWM) digital to analog converter, to form differential signals based on the voltage domain and time domain.

To achieve the above objects, the present invention provides a differential amplitude pulse width modulation (aPWM) digital to analog converter, including an aPWM module, connected to receive a digital audio data stream for generating differential pulse corresponding to the digital audio data stream, a power driver, connected to the aPWM module, and a filter, connected between the power driver and a terminal load, for removing unwanted harmonic signal in the power provided by the power driver to reconstruct an analog signal for outputting to the terminal load, wherein the aPWM module further includes a PWM generator to convert the received digital audio signal to a series of pulses having time domain width; an amplitude modulation unit, for receiving the digital audio signal to increase the time domain resolution of the pulse width and generating selection signals SX and SY; and a differential pulse generator, connected to the PWM generator to receive the series of pulses having time domain width and a positive/negative sign from the PWM generator and convert to differential form defined on voltage domain and time domain to output pulses DN and DP; wherein the power driver further includes a pulse amplitude selector, connected to a power source and receiving the selection signals SX and SY from the amplitude modulation unit to determine the amplitude of output pulses from the power source; and two power stages, connected respectively to the pulse amplitude selector and receiving the output pulses DN and DP from the differential pulse generator and outputting a pulse voltage VDN and a pulse voltage VDP.

In another exemplary embodiment, the present invention provides a coding scheme for the aPWM module, to use amplitude modulation on the input signal S, which is quantized as an N-bit representation, to increase the number of bits K of resolution. The N-bit quantized input signal S includes a 1-bit sign, a J-bit most significant bit (MSB) portion and a K-bit least significant bit (LSB) portion, wherein $$N = J + K, K = \log_2 \left\lfloor \frac{T_P}{T_R} \right\rfloor,$$

$T_P$ is a minimum pulse-width that can pass through a power drive without diminishing and $T_R$ is the minimum time resolution of the input signal S. Specifically, the aPWM outputs a VDP pulse voltage and a VDN pulse voltage, and for S ranging from $-(2^N-1)$ to $(2^N-1)$, the signal coding scheme defines Vo=VDP-VDN so that for any value S, Vo=S*$T_R$*Vcc.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
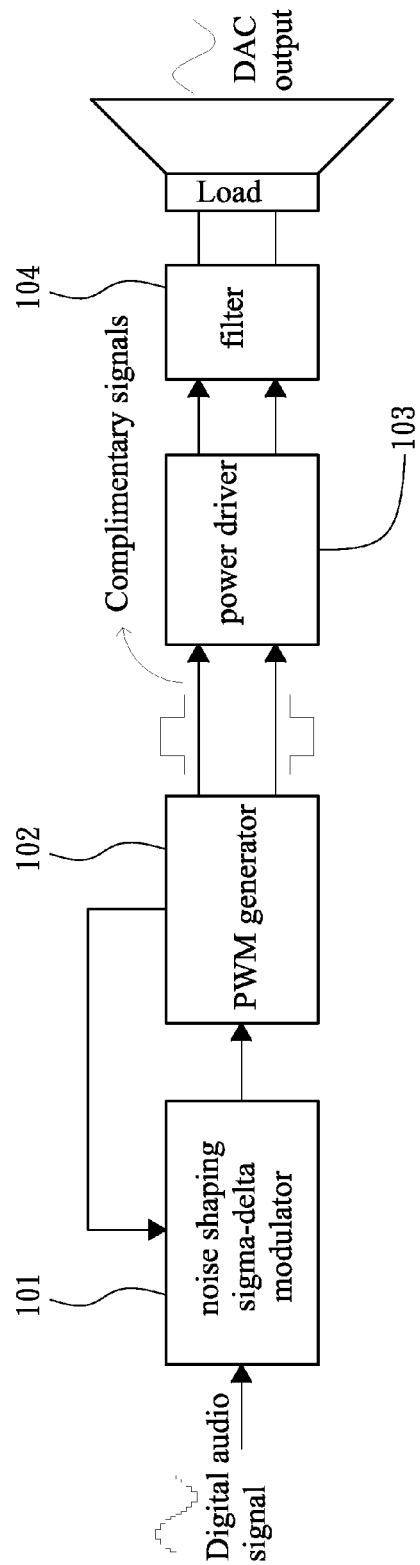
FIG. 1 shows a schematic view of a conventional Class-D amplifier.
Figure 2:
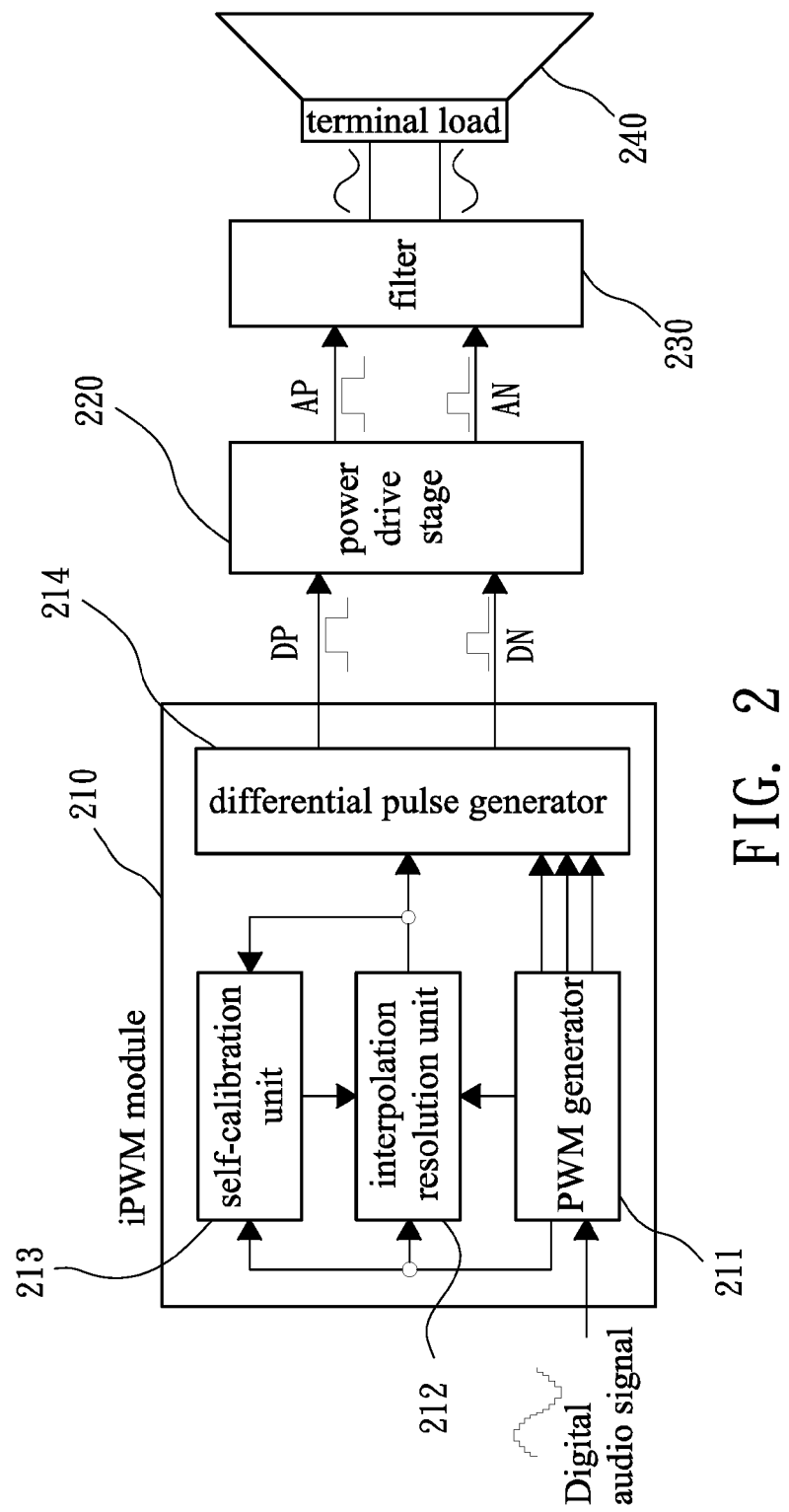
FIG. 2 shows a schematic view of a known iPWM digital-to-analog converter (DAC)
Figure 3:
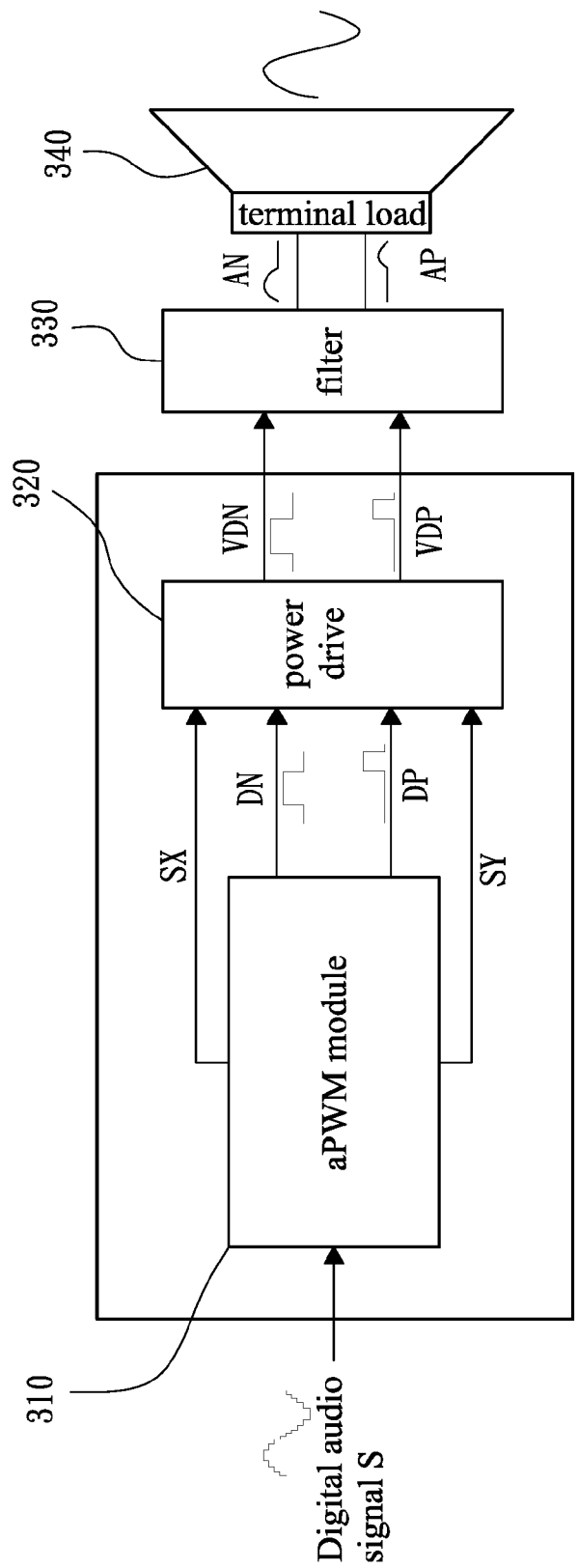
FIG. 3 shows a schematic view of an aPWM DAC according to the present invention.

FIG. 3 shows a schematic view of a differential amplitude pulse width modulation (aPWM) DAC according to the invention. As shown in FIG. 3, the aPWM DAC includes an aPWM module 310, a power drive 320 and a filter 30, wherein aPWM module 310 is connected to a digital audio input for receiving a digital audio input signal S. The filter 330 is connected to a terminal load 340, for example, a speaker. The power driver 320 is connected between the aPWM module 310 and the filter 330. The aPWM module 310 generates differential pulse according to the input signal S from the data stream of the digital audio input, the power driver 320 provides power to the terminal load 340 and the filter 330 removes unwanted harmonic signal in the process to reconstruct analog signal outputted to the terminal load 340.

Figure 4:
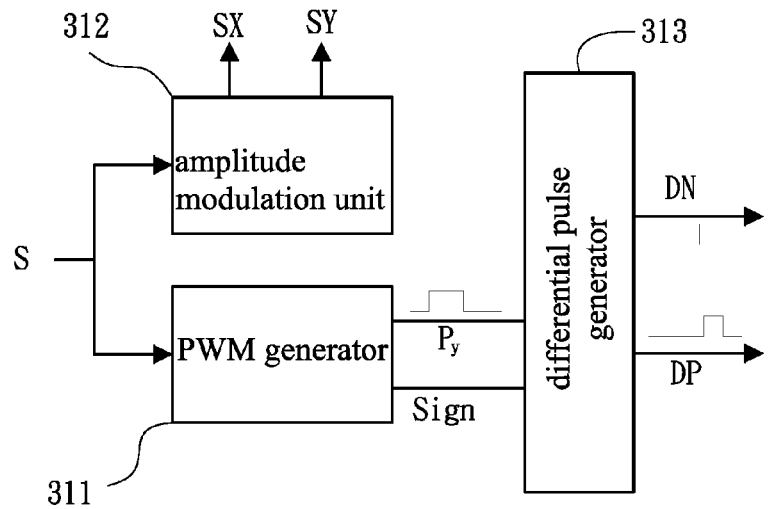
FIG. 4 shows a schematic view of the aPWM module of the aPWM DAC according to the present invention.

FIG. 4 shows a schematic view of the aPWM module of the aPWM DAC according to the present invention. The aPWM module 310 further includes a PWM generator 311, an amplitude modulation unit 312, and a differential pulse generator 313; wherein the PWM generator 311 converts the received digital audio signal S to a series of pulses Py having time domain width; the amplitude modulation unit 312 receives the digital audio signal S to increase the time domain resolution of the pulse width and generates selection signals SX and SY; and the differential pulse generator 313, connected to the PWM generator 311 to receive the series of pulses Py having time domain width and a positive/negative sign of the input signal S from the PWM generator 311 and convert to differential form defined on voltage domain and time domain, and outputs pulses DN and DP.

It should be noted that the PWM generator 311 can improve the pulse width resolution from $T_P$ to $T_R$ by using the digital phase locked-loop (DLL).

Figure 5:
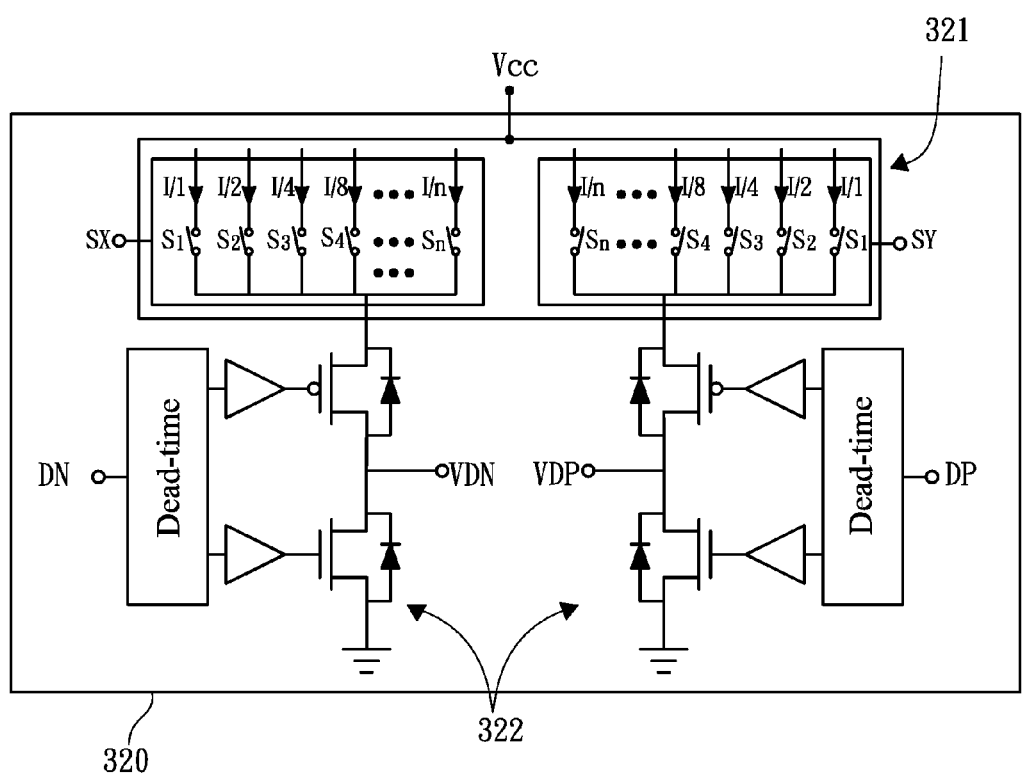
FIG. 5 shows a schematic view of the power driver of the aPWM DAC according to the present invention.

FIG. 5 shows a schematic view of the power driver of the aPWM DAC according to the present invention. The power driver 320 further includes a pulse amplitude selector 321, and two power stages 322. The pulse amplitude selector 321 determines the amplitude of the output pulse according to the selection signals SX and SY generated by the pulse modulation unit 312. In other words, the pulse amplitude selector 321 is connected to a power source Vcc and receives the selection signals SX and SY from the pulse amplitude unit 312 generator to determine the amplitude of output pulses from the power source. The two power stages 322 are connected respectively to the pulse amplitude selector 321, receive the output pulses DN and DP from the differential pulse generator 313 and output a pulse voltage VDN and a pulse voltage VDP. In the present embodiment, the pulse amplitude selector 321 includes a plurality of fixed-current switches connected in parallel, with each switch controlled by one bit of the selection signals SX and SY. Each switch controls the passing of I/n current respectively, where I is the current from Vcc and n is the bit position. Therefore, when the selection signals SX and SY use binary code, the switch allows respectively the passing of I/2, I/4, I/8, . . . , I/n of the current Vcc to corresponding power stage 322.

The pulse amplitude selector 321 is designed to output the pulse amplitude of Vcc when all the switches are on. On the other hand, when only Sn (I/n) switch is on, the output pulse amplitude=Vp, which corresponds to the aPWM DAC output voltage of the minimum time resolution $T_R$. For the amplitude modulation unit 312, when executing S<$2^K$, the generated selection signals (SX, SY) are transmitted to the pulse amplitude selector 321 so that S=1 to ($2^K-1$) is linearly mapped onto the pulse amplitude Vp to Vcc.

As aforementioned, the minimum time resolution must reach 122 ps to ensure the SNR is greater than 100 dB. In addition, because of the dead-time and the MOS parasitic capacitance, a small pulse width will be reduced in width when passing the power driver 320. Similarly, $T_P$ is defined the minimum pulse width able to pass the power driver 320 without diminishing and $T_R$ is defined as the minimum time resolution for the input signal. The following will describe how the present invention solves the aforementioned issues.

Figure 6:
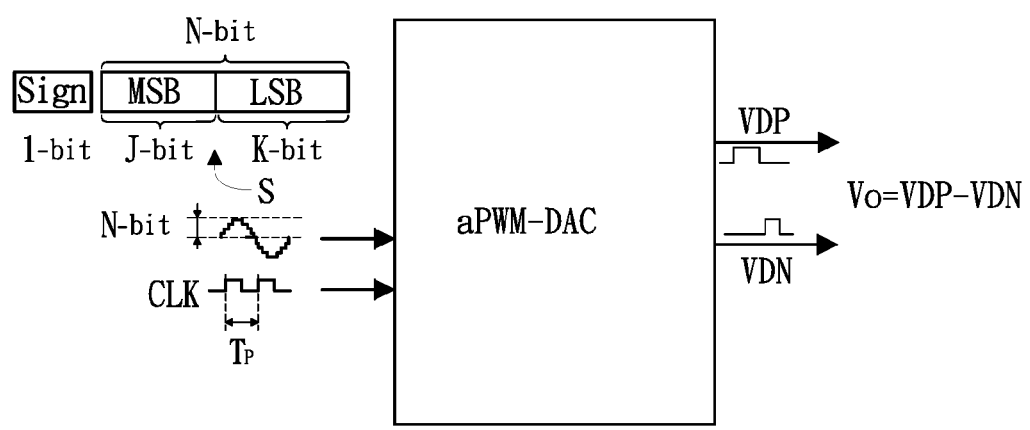
FIG. 6 shows a schematic view of input and output signals of the aPWM DAC according to the present invention.

FIG. 6 shows a schematic view of input and output signals of the aPWM DAC according to the present invention, wherein S is the digital input signal, and VDP and VDN are the output pulse voltage having width and amplitude. In addition, Vo is defined as VDP-VDN, i.e., the difference of the two pulse voltages. The aPWM DAC operates at the timing with a period of $T_P$. Because the digital input signal S is quantized as N-bit and includes a sign bit, a J-bit MSB portion, and a K-bit LSB portion, wherein $$N = J + K, K = \log_2 \left\lfloor \frac{T_P}{T_R} \right\rfloor,$$

$T_R$ is the minimum time resolution of the input signal S. The number of bits K can be computed by $$K = \log_2 \left\lfloor \frac{T_P}{T_R} \right\rfloor.$$

Figure 7:
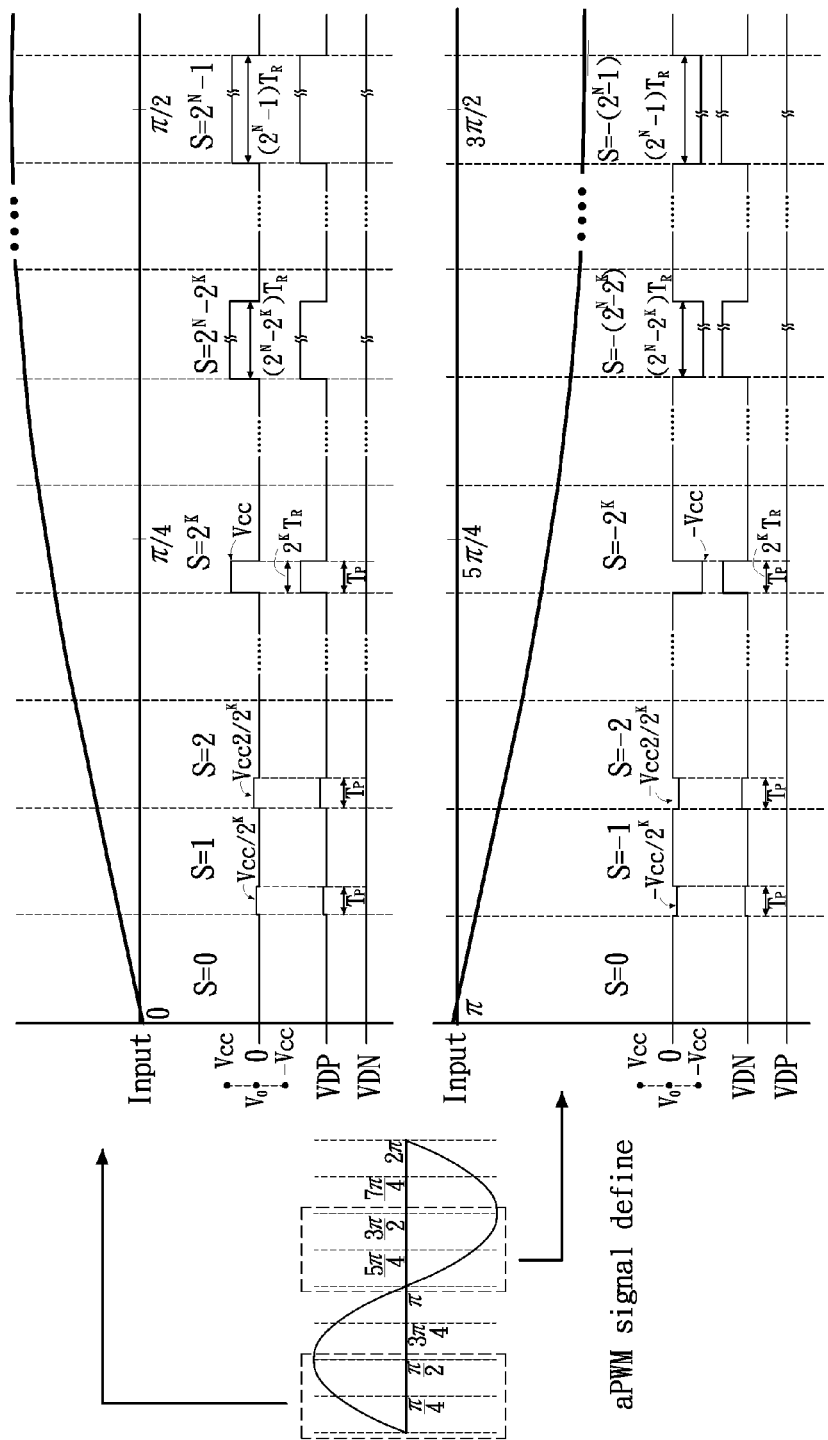
FIG. 7 shows a schematic view of the waveform of the output pulse periodic encoding scheme of the aPWM DAC according to the present invention.

FIG. 7 shows a schematic view of the waveform of the output pulse periodic encoding scheme of the aPWM DAC according to the present invention. As shown in FIG. 7, when S=0, there are two possible encodings. In other words, both VDP and VDN are pulses with width $T_P$ and the same amplitude. Alternatively, both VDP and VDN are pulses with or without width, i.e., no encoding for the pulses, V0=VDP-VDN=0. Similarly, for other values of S, Vo=VDP-VDN=S*Vcc*$T_R$.

Figure 8:
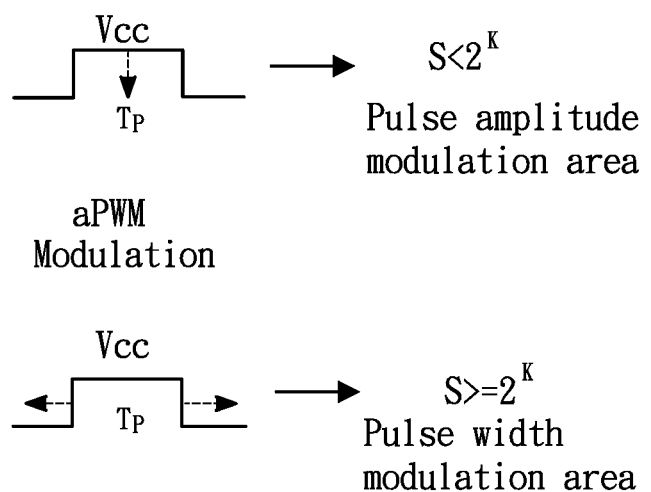
FIG. 8 shows a schematic view of the aPWM DAC according to the present invention based on the encoding ruler of FIG. 7.

FIG. 8 shows a schematic view of the aPWM DAC according to the present invention based on the encoding ruler of FIG. 7. As aforementioned, when S<$2^K$, the pulse amplitude unit 312 executes encoding and outputs selection signals SX and SY. In the present embodiment, the selection signals SX and SY are binary codes. Also referring to FIG. 5 wherein the pulse amplitude selector 321 includes a plurality of fixed-current switches connected in parallel, with each switch controlled by one bit of the selection signals SX and SY. Each switch controls the passing of I/n current respectively, where I is the current from Vcc and n is the bit position. For example, for k=7, when the input signal S=0x65<0x80=$2^7$, the selection signals SX and SY are encoded as SX=0x7F and SY=0x65; when the input signal S=0x165>0x80=$2^7$, the selection signals SX and SY are encoded as SX=0x7F and SY=0x7F, wherein SX=0x7F or SY=0x7F indicates that all the switches controlled by SX or SY are on.

Figure 9:
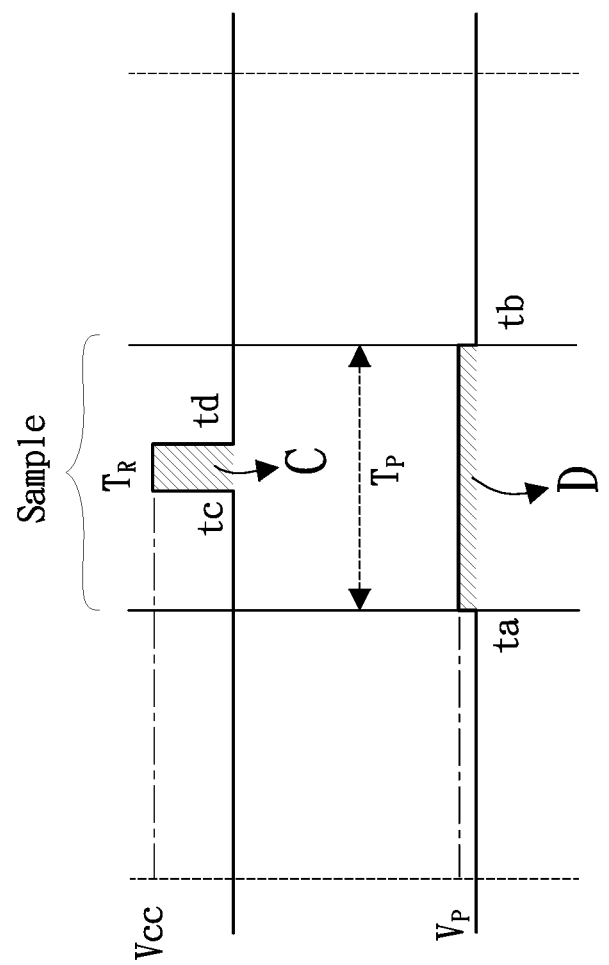
FIG. 9 shows a schematic view of the equivalent $T_R$ generation approach for the aPWM DAC according to the present invention.

FIG. 9 shows a schematic view of the equivalent $T_R$ generation approach for the aPWM DAC according to the present invention. As shown in FIG. 9, in a PWM time slot, the average voltage with respect to the minimum time resolution $T_R$ is:

$$C = \int_{tc}^{td} Vcc\, dt = T_R * Vcc$$

A minimum pulse width $T_P$ with amplitude Vp can be found to pass the power driver 320 without diminishing.

$$D = \int_{ta}^{tb} Vp\, dt = T_P * V_P$$

So that C=D, and Vp=$(T_R/T_P)$*Vcc.

In other words, the present invention can use the design of pulse amplitude selector 321, and the output pulse voltage Vo=Vp when the corresponding I/n switch is selected to design the aPWM DAC output voltage of the minimum time resolution $T_R$.

Figure 10:
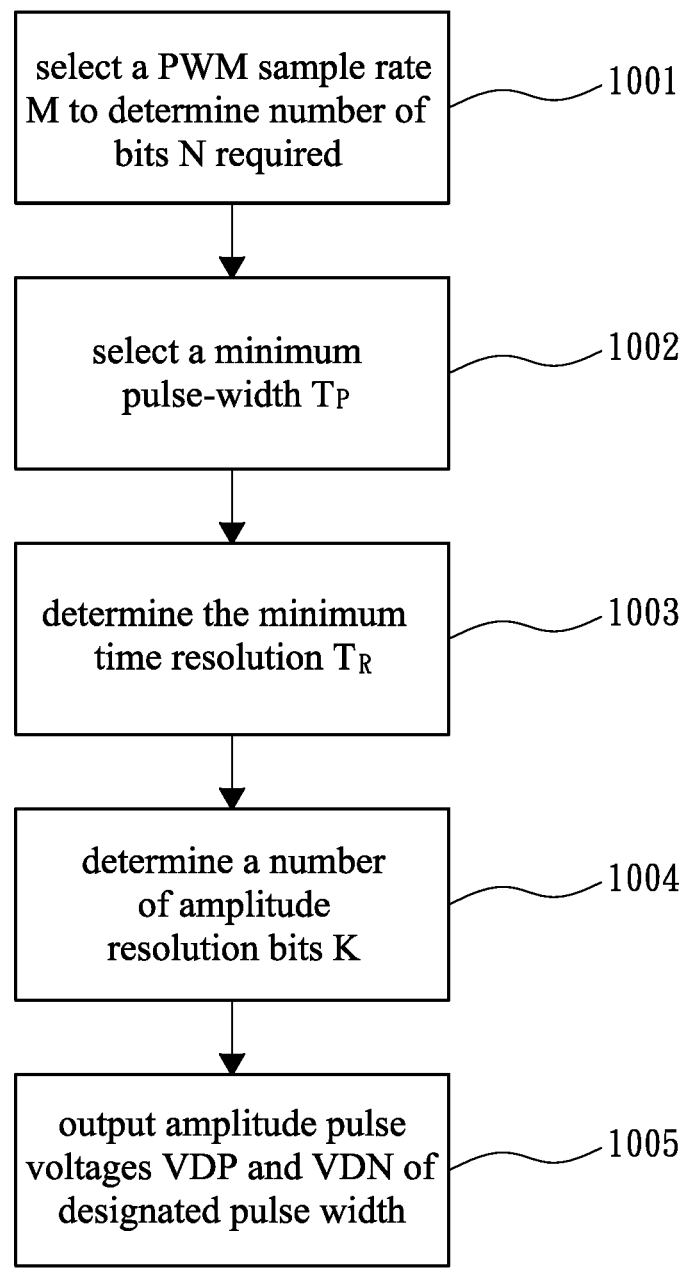
FIG. 10 shows a schematic view of flowchart of the encoding method for the output signal of the aPWM DAC according to the present invention.

FIG. 10 shows a schematic view of flowchart of the encoding method for the output signal of the aPWM DAC according to the present invention.

As shown in FIG. 10, Step 1001 is to select a PWM sample rate M to determine number of bits N required. For example, for audio bandwidth BW=20 Khz, SNR>100 dB, connecting to a 2 W power drive. When the PWM sample rate is selected as 500 Khz, M=500/20=25. Accordingly, the N can be determined as: SNR=6.02N+20 log(M)−11.18 dB, which results in N>13.92. Thus, N is determined to be 14 bits.

Step 1002 is to select a minimum pulse-width $T_P$ able to pass through a power driver without diminishing. Following the above example, $T_P$ is selected as 31.25 ns because in general, the minimum pulse-width is preferably greater than 30 ns.

Step 1003 is to determine the minimum time resolution $T_R$, as $$T_R = \frac{1}{2^N M \times BW} \sec = \frac{1}{16384 \times 25 \times 20K} = 122 \text{ ps}$$

Step 1004 is to determine a number of amplitude resolution bits K for input signal S quantized into an N-bit representation, which including a 1-bit sign, a J-bit MSB portion and a K-bit LSB portion, wherein $$N = J + K, K = \log_2 \left\lfloor \frac{T_P}{T_R} \right\rfloor,$$

and $T_R$ being the minimum time resolution of the input signal S. Following the above example, $$K = \log_2 \left\lfloor \frac{T_P}{T_R} \right\rfloor = \log_2 \left\lfloor \frac{31.25 \text{ ns}}{122 \text{ ps}} \right\rfloor = 8\text{-bit.}$$

Thus, J=N−K=14−8=6-bit.

Step 1005 is to output amplitude pulse voltages VDP and VDN of designated pulse width. For example, the pulses can be encoded following the encoding scheme in FIG. 8.

Figure 11B:
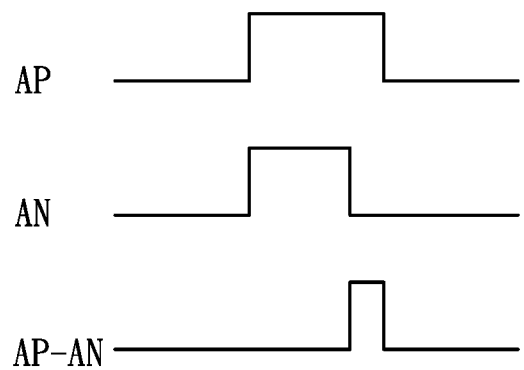
FIG. 11B shows a schematic view of waveform of the encoding scheme of the iPWM DAC of U.S. Pat. No. 9,161,122.
Figure 11A:
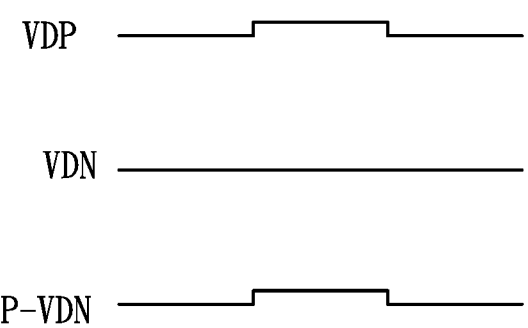
FIG. 11A shows a schematic view of waveform of the encoding scheme of the aPWM DAC according to the present invention.

FIGS. 11A and 11B show schematic views of waveform of the encoding scheme of the aPWM DAC according to the present invention, and waveform of the encoding scheme of the iPWM DAC of U.S. Pat. No. 9,161,122, respectively, wherein the waveform of AP and AN signals of iPWM encoding scheme is prone to the impact of the manufacturing process and wiring, and as a result, demanding higher technical requirements of manufacturing process and wiring. In comparison, the present invention is not less affected by the manufacturing process and wiring to generate SNR signals with high stability.

In summary, the differential amplitude pulse width modulation (aPWM) digital-to-analog (DAC) conversion and method for encoding output signal thereof according to the present invention is able to generate differential signals encoded according to the voltage domain and time domain with high SNR.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A differential amplitude pulse width modulation (aPWM) DAC apparatus comprising:
    an aPWM module for generating differential pulse according to input signals received from an input digital audio data stream;
    a power driver, connected to said aPWM module; and for providing energy to a terminal load; and
    a filter, connected between said power driver and said terminal load, for removing unwanted harmonic signal to reconstruct analog signals before outputting to said terminal load;
    wherein said aPWM module further comprising:
    a PWM generator to connect and convert said received input signals to a series of pulses having time domain width;
    an amplitude modulation unit, to receive said input signals to increase the time domain resolution of said pulse width and to generate selection signals SX and SY; and
    a differential pulse generator, connected to said PWM to receive the series of pulses having time domain width and a positive/negative sign from said PWM generator and convert to differential form defined on voltage domain and time domain to output pulses DN and DP;
    wherein said power driver further comprising:
    a pulse amplitude selector, connected to a power source and receiving said selection signals SX and SY from said amplitude modulation unit to determine the amplitude of output pulses from said power source; and
    two power stages, connected respectively to said pulse amplitude selector and receiving said output pulses DN and DP from said differential pulse generator and outputting a pulse voltage VDN and a pulse voltage VDP.

2. The apparatus as claimed in claim 1, wherein said aPWM module uses a PWM signal coding scheme to determine a number of bits K for an input signal S quantized into an N-bit representation having a 1-bit sign, a J-bit MSB portion and a K-bit LSB portion, wherein $$N = J + K, K = \log_2 \left\lfloor \frac{T_P}{T_R} \right\rfloor,$$

$T_P$ is a minimum pulse width able to pass through said power drive without diminishing and $T_R$ is the minimum time resolution of said input signal S; said aPWM outputs a pulse voltage VDP and a pulse voltage VDN, and for S ranging from $-(2^N-1)$ to $(2^N-1)$, said coding scheme defines output Vo=DP−DN so that for any value S, Vo=S*$T_R$*Vcc.

3. The apparatus as claimed in claim 2, wherein in said coding scheme, said input signal S and said selection signals SX and SY are in binary formats, and:
    when S<$2^K$ and S>0, SY=S, SX=111 . . . 1, wherein the number of bits of SX is K;
    when S<$2^K$ and S<=0, SX=S, SY=111 . . . 1, wherein the number of bits of SY is K;
    when S>=$2^K$, SX=111 . . . 1, SX=111 . . . 1, wherein the numbers of bits of SX and SY are K.

4. The apparatus as claimed in claim 2, wherein the minimum time resolution $T_R$ has an output voltage at ($T_R$/$T_P$)*Vcc, wherein Vcc is the voltage of said power source.

5. A coding method for output signals of differential amplitude pulse width modulation (aPWM) digital-to-analog (DAC) conversion apparatus, comprising the steps of:
    selecting PWM sample rate M to determine number of bits N required;
    selecting a minimum pulse-width $T_P$ able to pass through a power driver stage without diminishing;
    determining a minimum time resolution $T_R$;
    determining an number of interpolation resolution bits K for input signal S quantized into an N-bit representation having a 1-bit sign, a J-bit MSB portion and a K-bit LSB portion, wherein $$N = J + K, K = \log_2 \left\lfloor \frac{T_P}{T_R} \right\rfloor,$$

and $T_R$ being the minimum time resolution of said input signal S; and
    outputting a pulse voltage VDN and a pulse voltage VDP of designated pulse width;
    wherein pulses DP and DN of designated width;
    wherein for S ranging from $-(2^N-1)$ to $(2^N-1)$, said coding scheme defines output Vo=DP−DN; said input signal S and outputted encoded signals SX and SY are in binary formats, and:
    when S<$2^K$ and S>0, SY=S, SX=111 . . . 1, wherein the number of bits of SX is K;
    when S<$2^K$ and S<=0, SX=S, SY=111 . . . 1, wherein the number of bits of SY is K;
    when S>=$2^K$, SX=111 . . . 1, SX=111 . . . 1, wherein the numbers of bits of SX and SY are K.

6. The method as claimed in claim 5, wherein the minimum time resolution $T_R$ has an output voltage at ($T_R$/$T_P$)*Vcc, wherein Vcc is the voltage of said power source.

* * * * *